United States Patent
Li et al.

(10) Patent No.: US 10,103,569 B2
(45) Date of Patent: Oct. 16, 2018

(54) SYSTEM FOR CONTROLLING A POWER TRANSMISSION SYSTEM

(71) Applicant: Macau University of Science and Technology, Taipa (MO)

(72) Inventors: Zhiwu Li, Taipa (MO); Zhongyuan Jiang, Taipa (MO); Naiqi Wu, Taipa (MO); Mengchu Zhou, Taipa (MO)

(73) Assignee: MACAU UNIVERSITY OF SCIENCE AND TECHNOLOGY, Taipei (MO)

(*) Notice: Subject to any disclaimer, the term of this patent is extended or adjusted under 35 U.S.C. 154(b) by 82 days.

(21) Appl. No.: 15/078,367

(22) Filed: Mar. 23, 2016

(65) Prior Publication Data
US 2017/0279298 A1 Sep. 28, 2017

(51) Int. Cl.
*H02J 7/00* (2006.01)
*H02J 9/06* (2006.01)
*G01R 31/40* (2014.01)

(52) U.S. Cl.
CPC ............... *H02J 9/06* (2013.01); *G01R 31/40* (2013.01)

(58) Field of Classification Search
CPC .......... B60R 16/03; B63H 21/00; H02J 9/061; H02J 7/0065; H02J 7/007; H02J 7/0021
USPC .................................................. 307/9.1, 115
See application file for complete search history.

(56) References Cited

U.S. PATENT DOCUMENTS

| | | | | |
|---|---|---|---|---|
| 6,275,366 B1 * | 8/2001 | Gelbien | ................ | H02H 7/262 361/115 |
| 6,907,321 B2 * | 6/2005 | Kearney | ................ | H02H 3/063 700/292 |

OTHER PUBLICATIONS

R. David and H. Alia, "Discrete, Continuous, and Hybrid Petri nets," Springer, Heidelberg, 2005, pp. 1-5.
N. Q. Wu and M. C. Zhou, System Modeling and Control with Resource-Oriented Petri Nets, CRC Press, New York, pp. 1-14, 2010.
Z. W. Li and M. C. Zhou, Deadlock Resolution in Automated Manufacturing Systems: A Novel Petri Net Approach, pp. 1-10, 2009: Springer-Verlag.
S.W. Mohod and M.V. Aware, "Micro Wind Power Generator With Battery Energy Storage for Critical Load," IEEE System Journal, vol. 6, No. 1, pp. 118-125, 2012.

(Continued)

*Primary Examiner* — Dinh T Le
(74) *Attorney, Agent, or Firm* — Renner Kenner Greive Bobak Taylor & Weber

(57) ABSTRACT

A power transmission system includes a plurality of electrical substations and a plurality of transmission lines arranged to connect the plurality of electrical substations to form a power transmission network; and a controller system arranged to control a power transmission within the power transmission network. The controller system includes: a detection module arranged to detect an occurrence of a fault in at least one faulty electrical substation of the plurality of electrical substations; and a restoration module arranged to at least temporally maintain an output power of the at least one faulty electrical substation; and wherein at least one of the plurality of electrical substations is operable to facilitate maintaining of the output of the at least one faulty electrical substation upon the detection of the occurrence of the fault.

18 Claims, 10 Drawing Sheets

(56) References Cited

OTHER PUBLICATIONS

Z. Y. Lu, S. J. Wang, S. Y. Ge, and C. S. Wang, "Substation planning method based on the weighted voronoi diagram using an intelligent optimisation algorithm," IET Generation, Transmission and Distribution, vol. 8, No. 12, pp. 2173-2182, 2014.

K. Koller, T. Borsche, A. Ulbig, G. Andersson, "Review of grid applications with the zurich 1 MW battery energy storage system," Electric Power Systems Research, vol. 120, pp. 128-135, 2015.

N. Mukherjee and D. Strickland, "Control of second-life hybrid battery energy storage system based on modular boost-multilevel buck converter," IEEE Tran. Industrial electronics, vol. 62, No. 2, pp. 1034-1046, 2015.

C. F. Chien, S. L. Chen, and Y. S. Lin, "Using Bayesian network for fault location on distribution feeder," IEEE Trans. Power Del., vol. 17, No. 3, pp. 785-793, 2002.

T. Minakawa, Y. Lchikawa, M. Kunugi, and K. Shimada, "Development and implementation of a power system fault diagnosis expert system," IEEE Trans. Power Syst., vol. 10, No. 2, pp. 932-940, 1995.

T. Nagata, H. Sasaki, and R. Yokoyama, "Power system restoration by joint usage of expert system and mathematical programming approach," IEEE Trans. Power Syst., vol. 10, No. 3, pp. 1473-1479,1995.

H. W. Li, R. X. Lu, L. Zhou, B. Yang and X. M. Shen, "An Efficient Merkle-Tree-Based Authentication Scheme for Smart Grid," IEEE System Journal, vol. 8, No. 2, pp. 655-663, 2014.

M. R. Tu, J. H. Lin, R. S. Chen, K. Y. Chen, and J. S. Jwo, "Agent-Based Control Framework for Mass Customization Manufacturing With UHF REID Technoloty," IEEE System Journal, vol. 3, No. 3, pp. 343-359, 2009.

M. Vasirani, R. Kota, R. L. G. Cavalcante, S. Ossowski, and N. R. Jennings, "An agentbased approach to virtual power plants of wind power generators and electric vehicles," IEEE Trans. Smart Grid, vol. 4, No. 3, pp. 1314-1322, 2013.

J. A. Momoh, "Navy ship power system retoration using multi-agent approach," in Proc. IEEE Power Eng. Soc. General Meet., Montreal, Canada, 2006, pp. 14-18.

T. Nagata and H. Sasaki, "A multi-agent approach to power system restoration," IEEE Trans. Power Syst., vol. 17, No. 2, pp. 457-462, 2002.

Y. L. Xu and W. X. Liu, "Novel multiagent based load restoration algorithm for microgrids," IEEE Trans. Smru1 Grid, vol. 2, No. 1, pp. 152-161, 2011.

A. Zidan and E. F. El-Saadany, "A cooperative multiagent framework for Self-healing mechanisms in distribution systems," IEEE Trans. Smart Grid, vol. 3, No. 3, pp. 1525-1539, 2012.

G. Black and V. Vyatkin, "Intelligent component-based automation of baggage handling system with IEC 61499," IEEE Trans. Autom. Sci. Eng., vol. 7, No. 2, pp. 337-351, 2010.

V. Vyatkin, "IEC 61499 as enabler of distributed and intelligent automation: State of the art review," IEEE Trans. Ind. Info., vol. 7, No. 4, pp. 768-781,2011.

V. Vyatkin, G. Zhabelova, N. Higgins, K. Schwarz, and N.C. Nair, "Towards intelligent smart grid devices with IEC 61850 interoperability and IEC61499 open control architecture," in Proc. IEEE Conf. Transm. Distrib., Louisiana, USA, 2010, pp. 1-8.

Z. W. Li and M. C. Zhou, "Elementary siphons of Petri nets and their application to deadlock prevention in flexible manufacturing systems", IEEE Trans. Syst., Man, Cybern., A, vol. 34, No. 1, pp. 38-51, 2004.

Z. W. Li and M. C. Zhou, "Clarifications on the Definitions of Elementary Siphons in Petri Nets", IEEE Trans. Syst., Man Cybern., A, Syst. Humans, vol. 36, No. 6, pp. 1227-1229, 2006.

Z. W. Li and M. Zhao, "On controllability of dependent siphons for deadlock prevention in generalized Petri nets," IEEE Trans. Syst., Man, Cybern., A, vol. 38, No. 2, pp. 369-384, 2008.

Z. W. Li and M. C. Zhou, "On siphon computation for deadlock control in a class of Petri nets", IEEE Trans. Syst., Man, Cybern., A, Syst. Humans, vol. 38, No. 3, pp. 667-679, 2008.

G. Ramos, J. L. Sanchez, A. Tones, and M.A. Rios, "Power systems security evaluation using Petri nets," IEEE Trans. Power Del., vol. 25, No. 1, pp. 316-322,2010.

X. Luo and M. Kezunovic, "Implementing fuzzy reasoning Petri nets for fault section estimation," IEEE Trans. Power Del., vol. 23, No. 2, pp. 676-685, 2008.

V. Calderaro, C. N. Hadjicostis, A. Piccolo, and P. Siano, "Failure identification in smart grids based on petri net modeling," IEEE Trans. Ind. Elect.,vol. 58, No. 10, pp. 4613-4623, 2011.

* cited by examiner

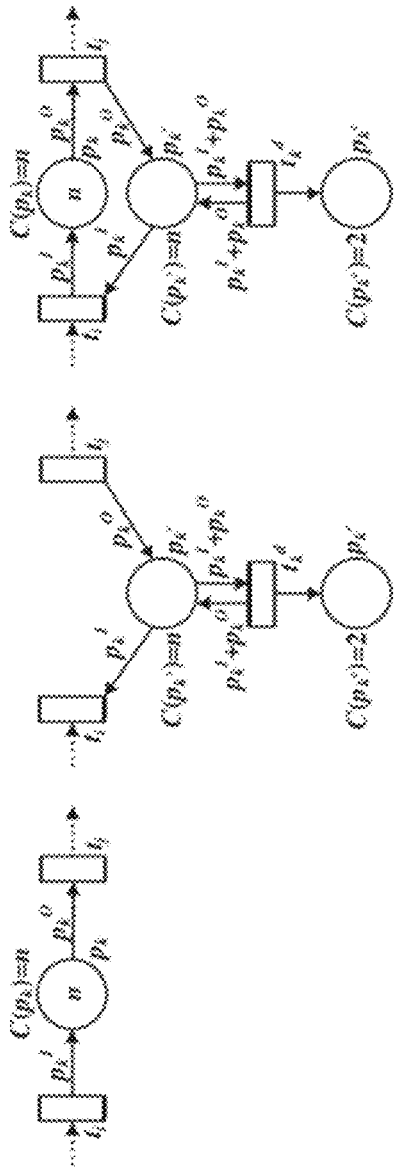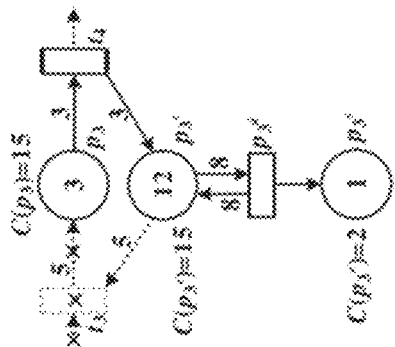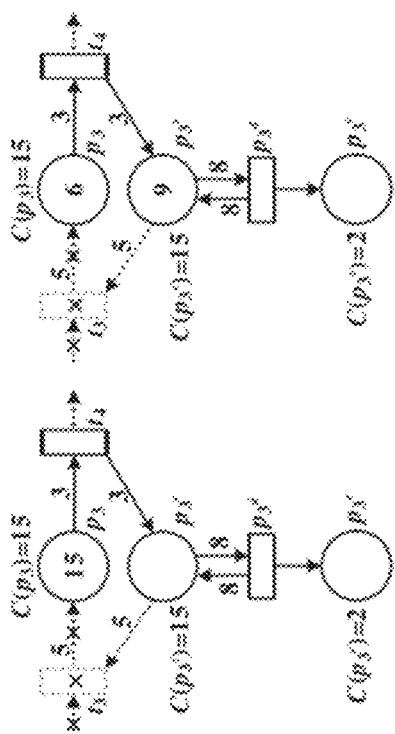
FIG. 5A FIG. 5B FIG. 5C
FIG. 6A FIG. 6B FIG. 6C

US 10,103,569 B2

SYSTEM FOR CONTROLLING A POWER TRANSMISSION SYSTEM

TECHNICAL FIELD

The present invention relates to a system for controlling a power transmission system and a power transmission system, although not exclusively, to a controller system for power transmission systems using a petri net fault diagnosis and restoration algorithm which may avoid large area blackouts.

BACKGROUND

Electrical power may be generated in power stations or power plants. Usually power stations are designed to generate large amount of power sufficient for the consumption within a predetermined coverage of geographical areas. Due to the large infrastructures, the operation considerations and the safety requirements, these power stations may be preferably built remote to the positions where the generated power may be eventually consumed, such as in premises of urban regions.

To facilitate the transmission of the generated electrical power from the power stations which may be remote from the end users, power transmission systems may be included to facilitate the power transmission. In some designs of the power transmission systems, intermediate electrical substations may be included to form connections between the power stations and the consumption area with a power transmission network which may be large enough to facilitate the power transmission requirement.

SUMMARY OF THE INVENTION

In accordance with a first aspect of the present invention, there is provided a system for controlling a power transmission system comprising: a detection module arranged to detect an occurrence of a fault in at least one faulty electrical substation of a plurality of electrical substations of the power transmission system; and a restoration module arranged to at least temporally maintain an output power of the at least one faulty electrical substation; wherein at least one of the plurality of electrical substations is operable to facilitate maintaining the output of the at least one faulty electrical substation upon the detection of the occurrence of the fault.

In an embodiment of the first aspect, the fault is a failure of receiving an input power from an original energy source in the at least one faulty electrical substation.

In an embodiment of the first aspect, the restoration module is further arranged to activate an auxiliary energy source arranged to at least temporally maintain the output power of the at least one faulty electrical substation.

In an embodiment of the first aspect, the auxiliary energy source includes at least one healthy electrical substations of the plurality of electrical substations, wherein the at least one healthy electrical substation is different from the at least one faulty electrical substation.

In an embodiment of the first aspect, at least two of the plurality of electrical substations is electrically interconnected.

In an embodiment of the first aspect, the at least two interconnected electrical substations include the at least one faulty electrical substation and the at least one healthy electrical substation, the at least one healthy electrical substation is configured to supply the input power to the at least one faulty electrical substation interconnected thereto so as to maintain the output of the at least one faulty electrical substation upon the occurrence of the fault.

In an embodiment of the first aspect, the at least two interconnected electrical substations belong to a same tier of a hierarchy of the power transmission system.

In an embodiment of the first aspect, the at least two interconnected electrical substations belong to a same stage of different branches of the power transmission system.

In an embodiment of the first aspect, the electrical connectivity between the interconnected electrical substations are controlled by the restoration module.

In an embodiment of the first aspect, the auxiliary energy source includes an energy storage system.

In an embodiment of the first aspect, the detection module is arranged to detect the occurrence of the fault by monitoring variations of the input power and the output power of the plurality of electrical substations.

In an embodiment of the first aspect, the detection module is further arranged to monitor transitions associated with the variations of the input power and the output power.

In an embodiment of the first aspect, the detection module is further arranged to compare a monitored parameter associated with the input power, the output power and the transitions monitored by the detection module with a predetermined threshold, such that the detection module is further arranged to determine the occurrence of the fault based on a comparison result associated with the compared monitored parameter and the predetermined threshold.

In an embodiment of the first aspect, the detection module is arranged to represent the plurality of electrical substations and the monitored transitions as one or more petri nets.

In accordance with a second aspect of the present invention, there is provided a power transmission system comprising: a plurality of electrical substations and a plurality of transmission lines arranged to connects the plurality of electrical substations to form a power transmission network; and a controller system arranged to control a power transmission within the power transmission network, wherein the controller system includes: a detection module arranged to detect an occurrence of a fault in at least one faulty electrical substation of the plurality of electrical substations; and a restoration module arranged to at least temporally maintain an output power of the at least one faulty electrical substation; and wherein at least one of the plurality of electrical substations is operable to facilitate maintaining of the output of the at least one faulty electrical substation upon the detection of the occurrence of the fault.

In an embodiment of the second aspect, the fault is a failure of receiving an input power from an original energy source in the at least one faulty electrical substation.

In an embodiment of the second aspect, at least two of the plurality of electrical substations are electrically interconnected, and when the at least two interconnected electrical substations include the at least one faulty electrical substation and at least one healthy electrical substation, the at least one healthy electrical substation is configured to supply the input power to the at least one faulty electrical substation interconnected thereto so as to maintain the output of the at least one faulty electrical substation upon the occurrence of the fault.

In an embodiment of the second aspect, the power transmission system further comprises an electrical switch arranged to selectively connect the at least two interconnected electrical substations electrically, wherein the electrical switch is controlled by the restoration module.

In an embodiment of the second aspect, the restoration module further comprises an energy storage system arranged to temporally maintain the output power of the at least one faulty electrical substation.

In an embodiment of the second aspect, the detection module further comprises an electrical sensing module arranged to obtain electrical parameters associated with the input power and the output power so as to facilitate the detection of the occurrence of the fault in the plurality of the electrical substations based on the electrical parameters.

BRIEF DESCRIPTION OF THE DRAWINGS

Embodiments of the present invention will now be described, by way of example, with reference to the accompanying drawings in which:

FIG. 5A is an illustration showing a petri net representation of an ES $p_k$;

FIG. 5B is an illustration showing a petri net representation of the supervisor of the ES $p_k$ of FIG. 5A;

FIG. 5C is an illustration showing a petri net representation of a combined system of ES $p_k$ of FIG. 5A and the supervisor of the ES $p_k$ of FIG. 5B;

FIG. 6A is an illustration showing a petri net representation of the combined system of FIG. 5C in accordance with the ES $p_3$ in FIG. 4A when a fault occurs in the input lines of $p_3$;

FIG. 6B is an illustration showing a petri net representation of the combined system of FIG. 6A when the fault may be detected;

FIG. 6C is an illustration showing a petri net representation of the combined system of FIG. 6A when the fault is detected;

DETAILED DESCRIPTION OF THE PREFERRED EMBODIMENT

Figure 1:
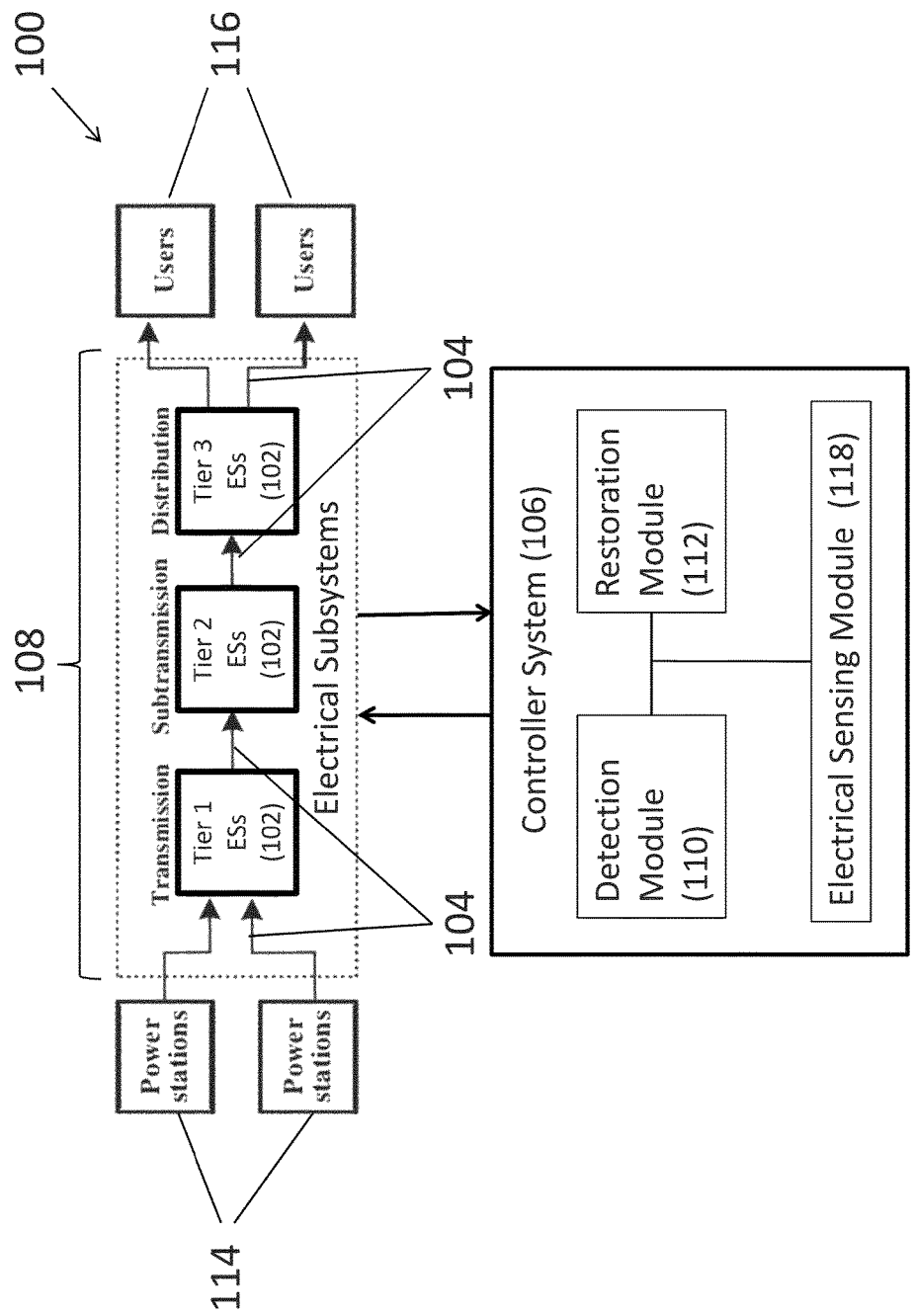
FIG. 1 is block diagram showing a power transmission system in accordance with one embodiment of the present invention.

The inventors have, through their own research, trials and experiments, devised that electric energy may be transmitted by power transmission systems such as traditional power transmission systems (TPTSs). A TPTS is a critical infrastructure, which may be composed of many electrical substations (ESs) and transmission lines. However, the instability of transmission lines usually causes many serious blackout events such as large area blackouts that will bring about disastrous economic losses. Battery energy storage systems may be installed at ESs for load leveling and relay protection. If a fault occurs in an ES, the battery energy storage system can continually supply electric power for its output. However, the capacities of batteries may be limited and thus the faults should be promptly detected and restored so as to avoid large area blackouts.

Expert system techniques may also be considered to implement fault detection and restoration in TPTSs. For example, a bayesian network for fault diagnosis on distribution feeders based on expert knowledge may be used. Alternatively, a fault diagnosis expert system aim at fault diagnosis in electric power systems may be used, such fault diagnosis expert system is integrated with several subsystems. In yet another alternative embodiment, a power system restoration method may include using an expert system and a mathematical programming approach. The target system for fault restoration is formulated as a mathematical programming problem. In these expert systems, the expert knowledge is optimized and updated with the information from continuous learning systems. However, the system information may also be interfered after the fault occurrence. It may affect the performance and reliability of expert systems.

Smart grids, also known as new generation power grids, may use advanced control systems to control TPTSs to perform automatic fault detection and restoration. Therefore, a reliable control system is extremely important for the automatic fault detection and restoration of smart grids.

Preferably, multi-agent technologies may be used as a method for the control systems of smart grids. A control system may be implemented based on multi-agent methods to perform fault detection and restoration for a navy ship system. It may detect and restore faults but only for a simplified system. In some other examples, various control systems based on multi-agent methods for fault detection and restoration may be implemented. The faults may be detected and restored by agents. However, these control systems are not formally modelled and verified by any formal method. The function blocks of IEC61499 provide a structure to model the industrial systems. For example, a control system by the forms of function blocks may be designed to perform fault detection and restoration for smart grids. The control system may be simulated by using Matlab-based simulation environment but lacks any formal verification.

The control systems of smart grids are typical discrete event systems. Petri nets, a graphical and mathematical tool, may be used to describe and analyze discrete event systems. It is possible to create mathematical models, state equations, and algebraic equations to analyze and verify the behavior of discrete event systems by using Petri nets. For example, Petri nets may be used to simulate supervisors to effectively prevent deadlocks in flexible manufacturing systems.

In power systems, Petri nets may also be used to evaluate the reliability and security of protection systems. A fuzzy Petri net technique may be used to deal with incomplete and uncertain alarms generated by protective relays and circuit breakers. Alternatively, a method based on Petri nets may be used to detect and localize faults in smart grids. The faults may be detected by computing the incidence matrices of Petri net models. However, the Petri net models and fault computations are complex and inefficient for large-scale smart grids. The fault restoration is neglected.

The inventors also devise that some of these control systems may be effective but complex because of a large number of ESs. They can detect and restore faults but do not consider large area blackout avoidance during the fault detection and restoration. Large area blackouts are intolerable in some special areas such as the hospitals, communication departments, and large-scale steel production manufacturers. Moreover, some of these methods are not formally described and verified.

With reference to FIG. 1, there is shown a power transmission system 100 comprising: a plurality of electrical substations 102 and a plurality of transmission lines 104 arranged to connects the plurality of electrical substations 102 to form a power transmission network 108; and a controller system 106 arranged to control a power transmission within the power transmission network 108, wherein the controller system 106 includes: a detection module 110 arranged to detect an occurrence of a fault in at least one faulty electrical substation of the plurality of electrical substations 102; and a restoration module 112 arranged to at least temporally maintain an output power of the at least one faulty electrical substation; and wherein at least one of the plurality of electrical substations 102 is operable to facilitate maintaining of the output of the at least one faulty electrical substation upon the detection of the occurrence of the fault.

In this embodiment, the controller system 106 is arranged to control all the power transmission activities within the power transmission network 108. The power transmission network 108 includes a plurality of electrical substations 102 (ESs) each connected to at least one adjacent electrical substation, a power source such as a power station 114 (or a subsequent conversion stage) and/or at least one electrical output load connected at a user end 116. The power transmission network 108 also includes a plurality of power transmission lines 104 for connected the above stages and/or electrical substations 102. Preferably, the distributed ESs 102 of the power transmission system 100 may form a hierarchy in the power transmission system 100. For example, the ESs may be divided into three layers or tiers, i.e., high, medium, and low voltage ESs, according to the three electric power transmission processes or stages, i.e., transmission, subtransmission, and distribution. Alternatively, the electrical substations 102 may be divided or grouped into different numbers of layers or tiers in the power transmission network 108.

In an example operation, a fault may occur when there is a failure of receiving an input power from an original energy source in a faulty ES 102. This may include a fault in an input source such as a power station 114 or an ES 102 in a higher tier or earlier stage for supplying a power input to the one in a lower tier or a later stage, or a failure in a transmission line 104 connecting the interconnected ESs in different stages. Subsequently, without a normal input power supply, the faulty ES may fail to provide a normal output to the later stages in the power transmission network 108. If the faulty ES is located in any of the earlier stages within the power transmission network 108, all of the later stages in the power transmission network 108 may not operate normally to supply electrical power to the end users 116, and may cause a large area blackout (LAB).

In the power transmission network 108, preferably, at least two of the plurality of the electrical substations 102 are interconnected, and preferably at least two of the plurality of the electrical substations 102 belong to a same tier of a hierarchy of the power or belong to a same stage of different branches of the power transmission system 100. In addition, the connectivity of the two interconnected electrical substations 102 is controlled by the restoration module 112, preferably by including at as an electrical switch controllable by the restoration module 112 to selectively connect the interconnected ESs that may be grouped in a same tier or stage within the power transmission network 108.

In an exemplary embodiment, if an occurrence of a fault in an ES is detected by the detection module 110 of the controller system 106, one or more of the healthy ESs (that is different from the faulty ES) preconnected to the faulty ES in the power transmission network 108 may be selected and activated to supply electric power to the faulty ES and the fault is restored. In this example, such healthy ES(s) may be used as an auxiliary energy source that may be used to at least temporally maintain the output power of the faulty electrical substation by supplying an input power to the faulty ES upon an occurrence of the fault. Therefore, the ES in the power transmission network 108 can uninterruptedly supply electric power for its output during the fault detection and restoration and a large area blackout is avoided. More examples of the detection and restoration schemes or algorithm will be discussed in later parts of this disclosure.

Optionally or additionally, the restoration module 112 may include an energy storage system as an additional or alternative auxiliary energy source to at least temporally maintain the power output of the faulty ES to the later stages in the power transmission network 108. Preferably, the energy storage system may be provided as a battery system which may be included in each of the ES 102 in the power transmission network 108, and may be activated by the restoration module 112 to supply a temporal energy source to the faulty ES at least for a certain period before the battery is drained empty, or when then faulty ES is powered by another auxiliary energy source such as the at least one interconnected healthy ES in the previous example.

Preferably, the detection module 110 may be arranged to represent the plurality of the electrical substations 102 and/or power transmission network 108, as well as any transition of states associated with the power transmission and/or the conversion occurred in the electrical substations 102 and monitored by the detection module 110 of the controller system 106, as one or more petri nets. The representation may be further processed by a processing module, which may include any processor, controller or processing units such as but not limited to a programmable logic device (PLD), a (field-)programmable gate array (FPGA), application-specific integrated circuit (ASIC), etc. Such processing module may be implemented as a part of the detection module 110, or the processing module may be a standalone module in the controller system 106, or the processing module may be arranged to communicate with the controller system 106 but is not included in the controller system 106.

In one example embodiment, the representation may involve a finite capacity Petri net. A finite capacity Petri net is a five-tuple $N=(P, T, F, W, C)$, where P and T are finite, disjoint, and non-empty sets. P is a set of places and T is a set of transitions. $F \subseteq (P \times T) \cup (T \times P)$ is a flow relation represented by arcs with arrows from places to transitions or from transitions to places. W: $F \rightarrow \mathbb{N}$ is a mapping that assigns a weight to an arc, where $\mathbb{N}$ is the set of non-negative integers. C: $P \rightarrow \mathbb{N}$ is a mapping that assigns a capacity to a place. A finite capacity Petri net can be represented by an input matrix $[N]^+ (p, t) = W(t, p)$ and an output matrix $[N]^- (p, t) = W(p, t)$, where $p \in P$ and $t \in T$.

The preset of a node $x \in P \cup T$ is defined as $^\bullet x = \{y \in P \cup T | (y, x) \in F\}$ and the postset of a node $x \in P \cup T$ is defined as $x^\bullet = (y \in P \cup T | (x, y) \in F)$. For a set of nodes $X \subseteq P \cup T$, $^\bullet X = \cup_{x \in X} {^\bullet x}$ and $X^\bullet = \cup_{x \in X} x^\bullet$. $|X|$ denotes the cardinality of X.

A marking M of N is a mapping from P to $\mathbb{N}$. M (p) denotes the number of tokens in place p. Place p is marked by marking M if M (p)>0. (N, $M_0$) is called a net system, where $M_0$ is the initial marking of N.

In a finite capacity Petri net, $t \in T$ is enabled at marking M if $\forall p \in {^\bullet t}$, M (p) $\geq$ W (p, t) and $\forall p' \in t^\bullet$, M (p') $\leq$ C (p')−W (t, p'), which is denoted as M [t⟩. If t fires, a new marking M' is obtained such that $\forall p'' \in P$, M' (p'') = M (p'')−W (p'', t)+W (t, p''), denoted by M [t⟩ M'. Marking M'' is called a reachable marking from M if there exists a transition sequence $\sigma = t_1 t_2 \ldots t_n$ such that M [$t_1$⟩ $M_1$ [$t_2$⟩ $M_2$ ... $M_{n-1}$ [$t_n$⟩ M''. It is denoted by M [$\sigma$⟩ M''. It satisfies M''=M+$[N]^+ \vec{\sigma} - [N]^- \vec{\sigma}$, where $\vec{\sigma}$: T→$\mathbb{N}$ is a vector of non-negative integers and $\vec{\sigma}$ (t) represents the sum of all occurrences of t in σ. The set of reachable markings from M in N is denoted as $\mathcal{R}$ (N, M).

For example, let $p \in P$ be a place. All transitions in $^\bullet p \cup p^\bullet$ are enabled at marking M if:

$$\forall t_i \in {^\bullet p}: \forall p' \in {^\bullet t_i}, M(p') \geq W(p', t_i) \quad 1)$$

$$C(p) - M(p) \geq \sum_{t_i \in {^\bullet p}} W(t_i, p) \quad 2)$$

$$M(p) \geq \sum_{t_j \in p^\bullet} W(p, t_j) \quad 3)$$

$$\forall t_j \in p^\bullet: \forall p'' \in t_j^\bullet, C(p'') - M(p'') \geq W(t_j, p'') \quad 4)$$

According to Eqs. (1) and (2), if all transitions in $^\bullet p \cup p^\bullet$ are enabled:

$$C(p) \geq \sum_{t_i \in {^\bullet p}} W(t_i, p) = \sum_{t_j \in p^\bullet} W(p, t_j)$$

Let $t_1$ and $t_2$ be two transitions, σ be a transition sequence of $t_1$ and $t_2$, and M be a marking. If $t_1$ and $t_2$ can fire at marking M:

$t_1$ can fire first followed by $t_2$, denoted as $\sigma = t_1 t_2$,
$t_2$ can fire first followed by $t_1$, denoted as $\sigma = t_2 t_1$, or
$t_1$ and $t_2$ can fire simultaneously, denoted as $\sigma = \{t_1 t_2\}$.

In order to describe the simultaneous events of discrete event systems in this paper, an assumption may be made as follows:

Assumption 1: Let N be a finite capacity Petri net with N=(P, T, F, W, C), $t_1, t_2, \ldots, t_n \in T$ be n (n>1) transitions, and M be a marking of N. If $t_1$-$t_n$ can fire at marking M, then $t_1$-$t_n$ fire simultaneously, denoted as $\sigma = \{t_1 t_2 \ldots t_n\}$.

Figure 2:
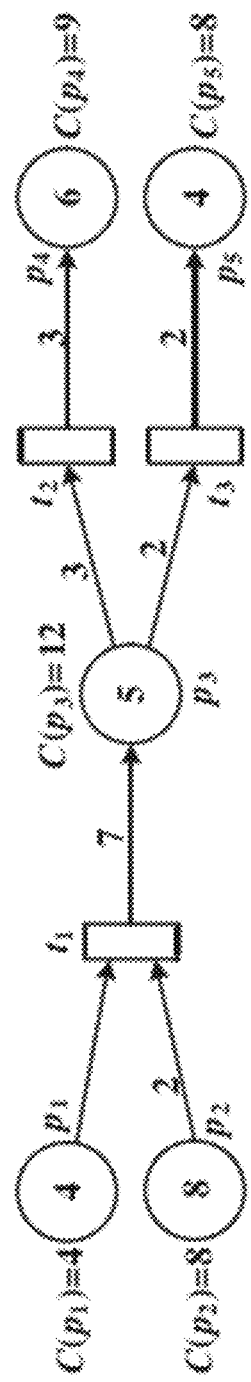
FIG. 2 is an illustration of a finite capacity Petri net.

With reference to FIG. 2, there is shown a finite capacity Petri net, where $^\bullet t_1 = \{p_1, p_2\}$, $p_3^{\bullet\bullet} = t_2 \cup t_3^{\bullet\bullet} = \{p_4, p_5\}$, and C($p_3$)=W($t_1$, $p_3$)+(W ($p_3$, $t_2$)+W($p_3$, $t_3$))=7+(3+2)=12. The input matrix $[N]^+$ and output matrix $[N]^-$ are:

$$[N]^+ = \begin{pmatrix} 000 \\ 000 \\ 700 \\ 030 \\ 002 \end{pmatrix} \text{ and } [N]^- = \begin{pmatrix} 100 \\ 200 \\ 032 \\ 000 \\ 000 \end{pmatrix}$$

At the initial marking $M_0 = (4, 8, 5, 6, 4)^T$, transitions $t_1$-$t_3$ can fire simultaneously. Let $\sigma_1 = \{t_1 t_2 t_3\}$. Then, $\vec{\sigma}_1 = (1, 1, 1)^T$. If $t_1$-$t_3$ fire simultaneously, a marking $M_1$ is obtained by:

$$M_1 = M_0 + [N]^+ \cdot \vec{\sigma}_1 - [N]^- \cdot \vec{\sigma}_1 = (3, 6, 7, 9, 6)^T.$$

At marking $M_1$, only $t_3$ is enabled since:

$C(p_3) - M_1(p_3) = 5 < W(t_1, p_3) = 7$ and $C(p_4) - _1(p_4) = 0 < W(t_2, p_4) = 3$.

Let $\sigma_2 = t_3$. Therefore $\vec{\sigma}_2 = (0, 0, 1)^T$. When $t_3$ fires, a new marking $M_2$ is obtained by:

$$M_2 = M_1 + [N]^+ \cdot \vec{\sigma}_2 - [N]^- \cdot \vec{\sigma}_2 = (3, 6, 5, 9, 8)^T.$$

At marking $M_2$, only $t_1$ is enabled. Let $\sigma_3 = t_1$. Therefore $\vec{\sigma}_3 = (1, 0, 0)^T$. If $t_1$ fires, a new marking $M_3$ is obtained by:

$$M_3 = M_2 + [N]^+ \cdot \vec{\sigma}_3 - [N]^- \cdot \vec{\sigma}_3 = (2, 4, 12, 9, 8)^T.$$

At marking $M_3$, $t_1$-$t_3$ are disabled since $C(p_3) - M_3(p_3) = 0 < W(t_1, p_3) = 7$, $C(p_4) - M_3(p_4) = 0 < W(t_2, p_4) = 3$, and $C(p_5) - M_3(p_5) = 0 < W(t_3, p_5) = 2$.

The whole processes can also be represented as:

$$M_3 = M_0 + [N]^+ \cdot \vec{\sigma} - [N]^- \cdot \vec{\sigma} = (2, 4, 12, 9, 8)^T,$$

where $\sigma = \{t_1 t_2 t_3\} t_3 t_1$ and $\vec{\sigma} = \vec{\sigma}_1 + \vec{\sigma}_2 + \vec{\sigma}_3 = (2, 1, 2)^T$.

The power transmission system 100 (or sometimes referred as a tradition power transmission system (TPTS) in this disclosure) may composed of a plurality distributed ESs that have input and output lines. These ESs can be divided into three layers, i.e., high, medium, and low voltage ESs, according to the three electric power transmission processes, i.e., transmission, subtransmission, and distribution, as shown in FIG. 1. In a TPTS, the electric power is transmitted from high voltage ESs to medium voltage ESs and is continually transmitted from the medium voltage ESs to low voltage ESs. However, some of the input lines of ESs may be fragile, which may suffer from faults that should be detected and restored quickly. Moreover, large area blackouts may occur in ESs during the fault detection and restoration since the faulty ES cannot supply enough electric power for its output.

In a TPTS, each ES may contain a battery energy storage system that can be considered as an energy storage buffer for the temporary output of the ES during the fault detection and restoration. The batteries of the battery energy storage system have a finite capacity. Therefore, a Capacity-TPTS (C-TPTS) can be defined by finite capacity Petri nets as follows.

Definition 1: A C-TPTS is defined as a finite capacity Petri net N=($P_h \cup P_m \cup P_l$, T, F, W, C), where:

1) $P_h \neq \emptyset$, $P_m \neq \emptyset$, and $P_l \neq \emptyset$ are the sets of high, medium, and low voltage ESs, respectively, $P_h \cap P_m \cap P_l = \emptyset$, $p_h^{T\bullet\bullet} = p_m^T$, and $p_m^{T\bullet\bullet} = p_l^T$.

2) T is the set of electric power transmission operations.

3) $F \subseteq (P_h \times T) \cup (T \times P_m) \cup (P_m \times T) \cup (T \times P_l)$ is the set of electric power transmission arcs.

4) $\forall p_h \in P_h$, $\exists t \in T$ and $\exists p_m \in P_m$ such that $\{p_h\} = {}^\bullet t$ and $t^\bullet = \{p_m\}$.

5) $\forall p_m \in P_m$, (a) $\exists t \in T$ and $\exists p_l \in P_l$ such that $\{p_m\} = {}^\bullet t$ and $t^\bullet = \{p_l\}$ and (b) there only exist a transition $t' \in T$ and a place $p_h \in P_h$ such that $\{p_h\} = {}^\bullet t'$ and $t'^\bullet = \{p_m\}$.

6) $\forall p_l \in P_l$, there only exist a transition $t \in T$ and a place $p_m \in P_m$ such that $\{p_m\} = {}^\bullet t$ and $t^\bullet = \{p_l\}$.

7) W: $F \rightarrow \mathbb{N}$ is a mapping that assigns a number of power loads to an electric power transmission arc.

8) C: $P \rightarrow \mathbb{N}$ is a mapping that assigns an electric power capacity to an ES.

In a C-TPTS, $\forall p \in (P_h \cup P_m \cup P_l)$, p has input loads (denoted as $p^I$), output loads (denoted as $p^O$), and available loads (denoted as $p^A$) that can be supplied to other ESs to restore faults, where $p^I \geq p^O$. The power balance in p is $$p^A = p^I - p^O = \sum_{t_i \in {}^\bullet p} W(t_i, p) - \sum_{t_j \in p^\bullet} W(p, t_j). \quad (4)$$

Figure 3A:
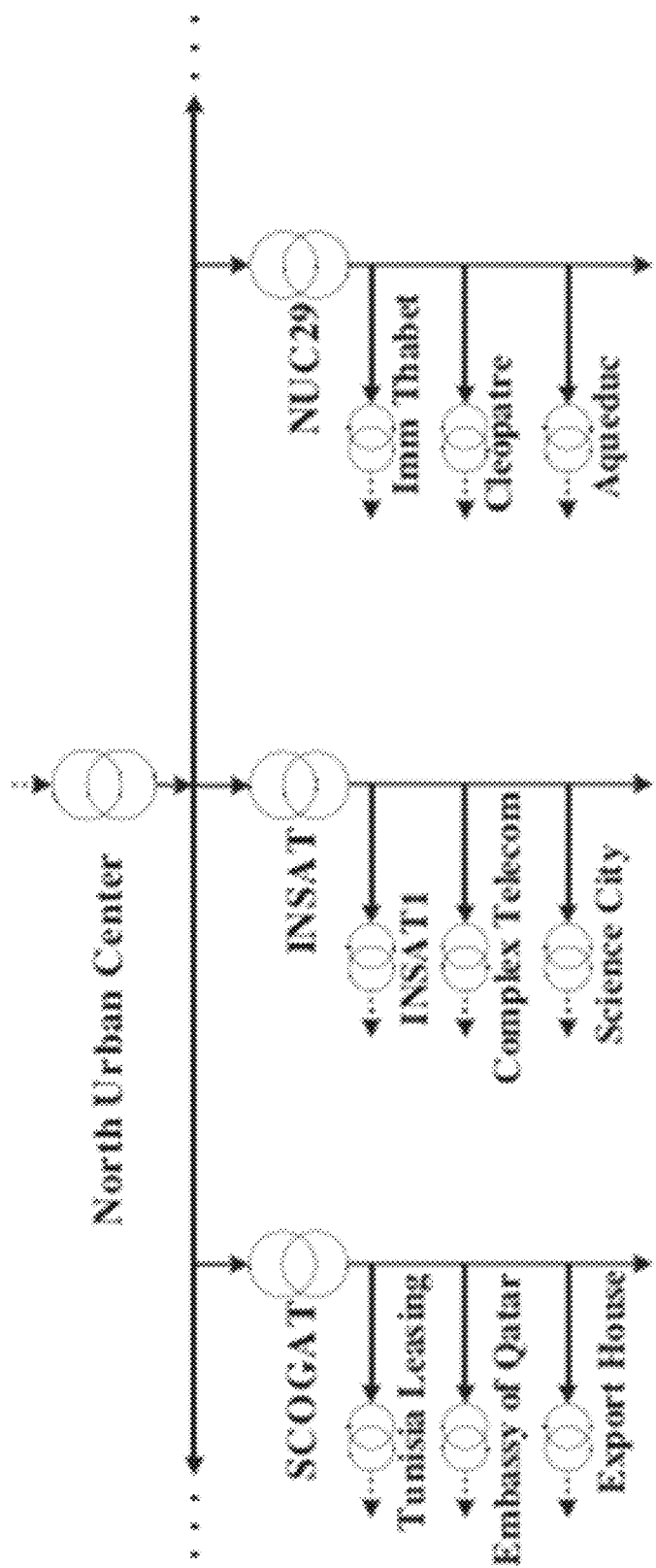
FIG. 3A is an illustration showing an example TPTS of WLC/NUC.
Figure 3B:
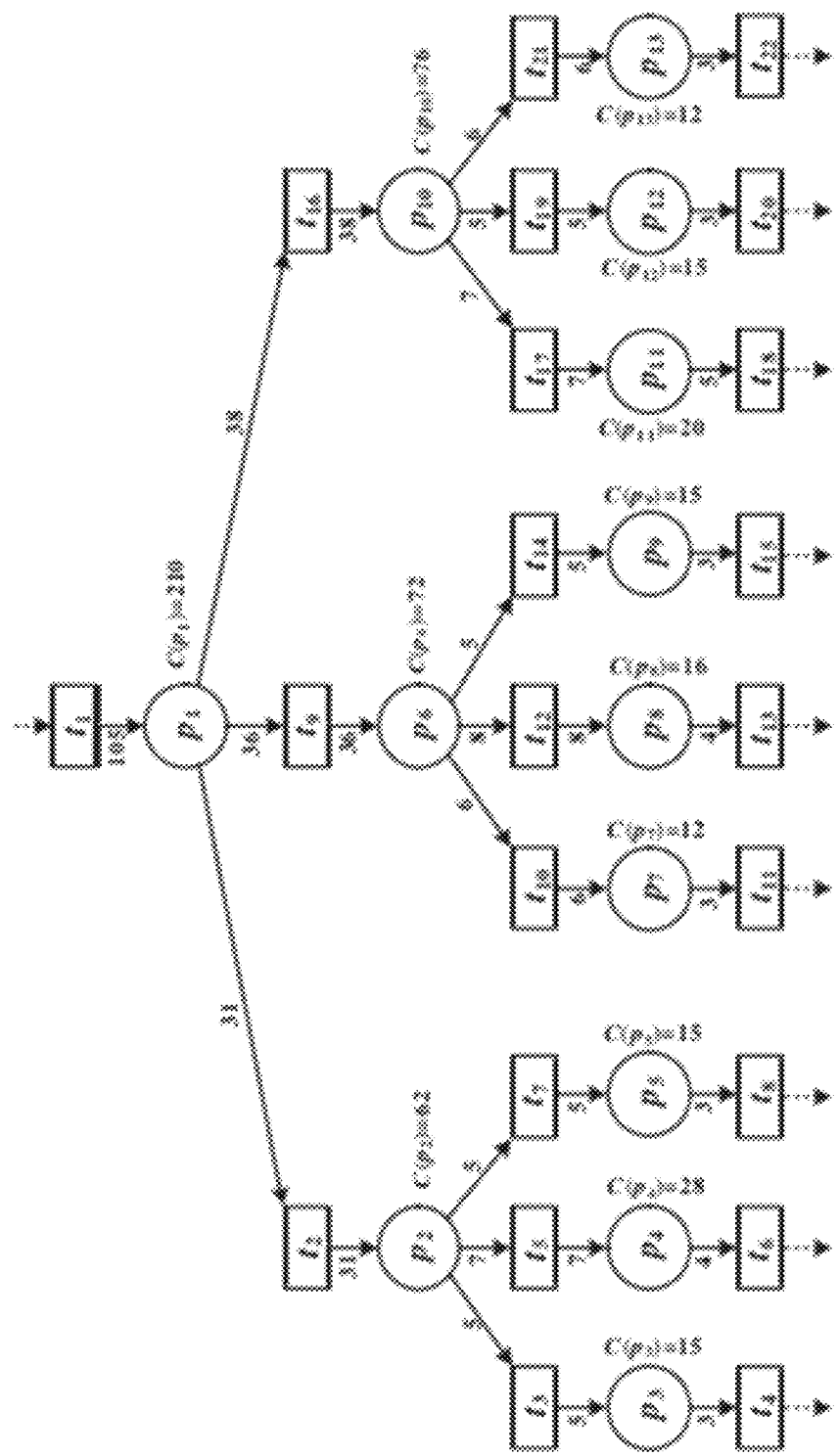
FIG. 3B is an illustration a C-TPTS model representing the TPTS of FIG. 3A using petri net representation.

In an example embodiment with reference to FIG. 3A, there is shown a TPTS that may represent the part of West Lake Center/North Urban Center (WLC/NUC) in Tunis (Tunisia). A C-TPTS representation based on the TPTS is shown in FIG. 3B. In this example, the electric power may be transmitted from "North Urban Center" to "SCOGAT" and may be continually transmitted from "SCOGAT" to "Tunisia Leasing" in FIG. 3A. Correspondingly, the electric power is transmitted from $p_1$ to $p_2$ by $t_2$ and is continually transmitted from $p_2$ to $p_3$ by $t_3$ in FIG. 3B.

Proposition 1: Let N be a C-TPTS with $N=(P_h \cup P_m \cup P_l)$, T, F, W, C), $p \in \{P_h \cup P_m \cup P_l\}$ be an ES, $M_0$ be the initial marking of N, and $M \in \mathcal{R}(N, M_0)$ be a marking. At marking M, a large area blackout occurs in ES p if $M(p) < p^O$.

Proof: At marking M, if $M(p) < p^O$, $\exists t \in p^\bullet$ such that $M[t\rangle$ does not hold. This means that t cannot fire at marking M and ES p cannot supply electric power to its downstream ESs. Then, a large area blackout occurs in p.

For ES $p_3$ in FIG. 3B, $p_3^I=5$ KW, $p_3^O=3$ KW, and $C(p_3)=15$ KW, where KW represents kilowatts. Then, $p_3^A=p_3^I-p_3^O=2$ KW. If it is assumed that $M_0(p_3)=C(p_3)$, $\forall M \in \mathcal{R}(N, M_0)$, $M(p_2) \geq p_2^O$, and a fault occurs in the inputlines of "Tunisia Leasing" in FIG. 3A, then $t_3$ cannot fire to add tokens to $p_3$ in FIG. 3B.

Figures 4A, 4B, 4C, 4D:
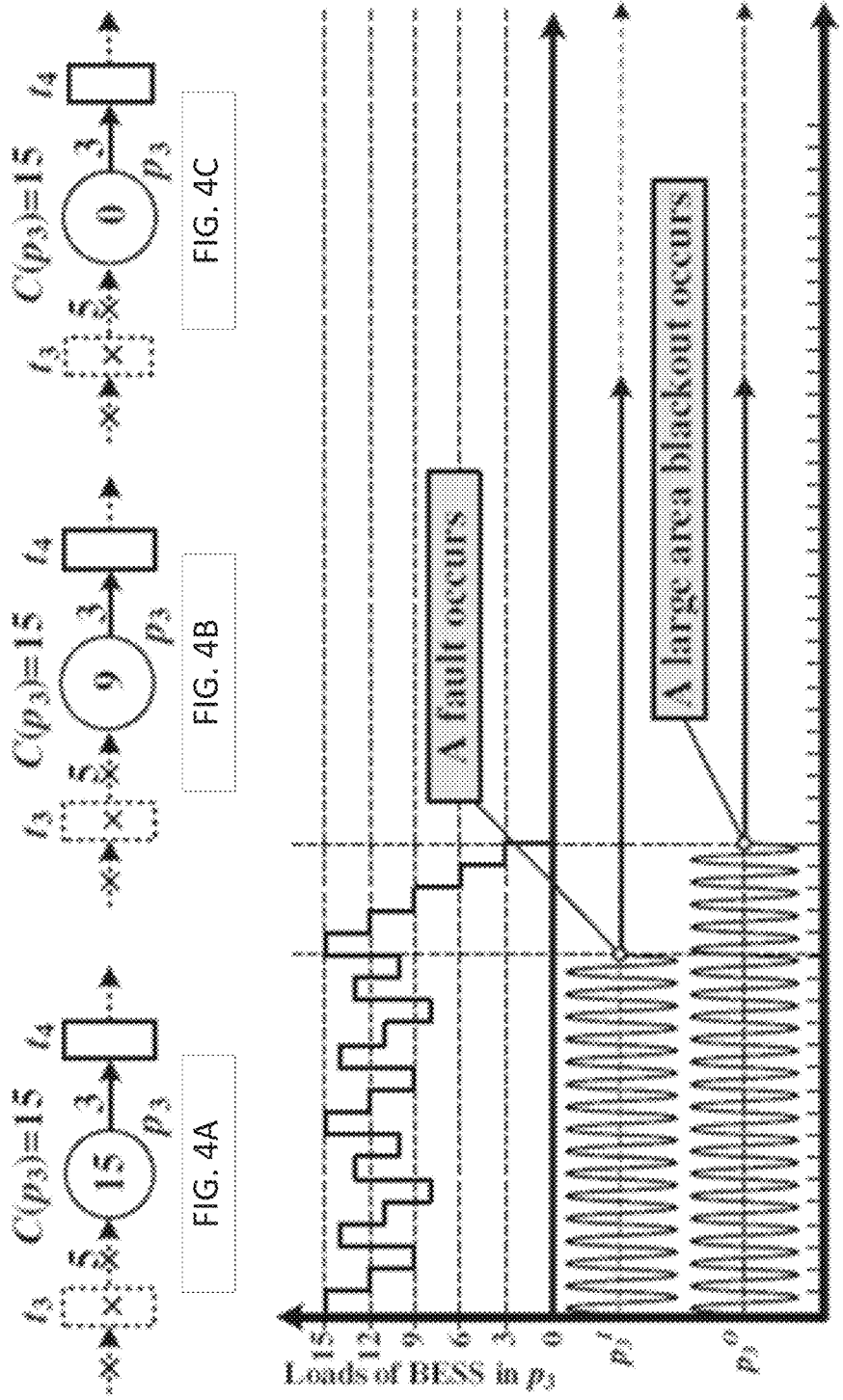
FIG. 4A is an illustration showing a portion of the C-TPTS model representing a fault that occurs in $p_3$.
FIG. 4B is an illustration showing the C-TPTS model in FIG. 4A at a state after $t_4$ firing twice.
FIG. 4C is an illustration showing the C-TPTS model in FIG. 4A at a state when a large area blackout occurs in $p_3$ after $t_4$ fires five times.
FIG. 4D is an illustration showing the fault occurrence evolution in $p_3$ of FIG. 4A.

With reference to FIG. 4A, there is show a situation where a fault occurs. Then, transition $t_4$ can continually fire five times since $$M(p_3)=C(p_3)-5p_3^O=15 \text{ KW}-5 \times 3 \text{ KW}=0 \text{ KW} < p_3^O.$$

The processes of the operations are shown in FIGS. 4B and 4B. It is illustrated that ES $p_3$ can continually supply electric power to its downstream ESs until its power loads are exhausted. During the firing of $t_4$ for five times, the fault occurred in the input lines of $p_3$ should be detected and restored. Otherwise, a large area blackout will be caused. The fault occurrence evolution is illustrated in FIG. 4D.

Preferably, a model of supervisors may be implemented to detect faults for ESs by using finite capacity Petri nets. The detection module 110 may be arranged to detect the occurrence of the fault by monitoring variations of the input power and the output power, as well as the associated transitions, of the plurality of ESs 102.

In one example embodiment, the detection module 110 further comprises an electrical sensing module 118 arranged to obtain electrical parameters associated with the input power and the output power of the plurality of ESs 102, and the detection module 110 may compare the monitored/obtained parameter associated with the input power, the output power and the transitions monitored by the detection module 110 with a predetermined threshold, such that the detection module 110 may determine the occurrence of the fault based on a comparison result associated with the compared monitored parameter and the predetermined threshold.

In the following example, the electric power variations of each ES are supervised by a corresponding supervisor.

Property 1: Let N be a C-TPTS, $p \in (P_h \cup P_m \cup P_l)$ be an ES, $t \in T$ be a transition such that $\{t\} = {}^\bullet p$, $\sigma$ be a transition sequence such that $\forall t_i \in p^\bullet$, $\vec{\sigma}(t_i)=1$, and $M_1$, $M_2 \in \mathcal{R}$ (N, $M_0$) be two markings such that $\forall p_i \in {}^\bullet t$, $M_1(p_i) \geq W(p_i, t)$, $M_2(p_i) \geq W(p_i, t)$, $C(p)-M_1(p) \geq p^I$, and $M_1[\sigma\rangle M_2$, where $M_0$ is the initial marking. A fault that occurs in the input lines of p can be detected at $M_2$ if:

$$C(p)-M_2(p) \geq p^I + p^O \quad (5)$$

Proof: Since $M_1[\sigma\rangle M_2$, $M_2(p) = M_1(p) + p^I - p^O$.

By $C(p) - M_1(p) \geq p^I$, $$C(p) - M_2(p) = C(p) - M_1(p) - p^I + p^O \geq p^I - \vec{\sigma}(t) \cdot W(t, p) + p^O =$$
$$p^I + p^O - \vec{\sigma}(t) * W(t, p).$$

Eq. (5) holds if $\vec{\sigma}(t)=0$. This means that t cannot fire at marking $M_1$. However, t is enabled at marking $M_1$ since $\forall p_i \in {}^\bullet t$, $M_1(p_i) \geq W(p_i, t)$, and $C(p)-M_1(p) \geq W(t, p)$. Therefore, it is ensured that a fault occurs in the input lines of p and the fault can be detected at marking $M_2$.

According to Property 1, $\forall p \in (P_h \cup P_m \cup P_l)$, a fault that occurs in the input lines of p can be detected by monitoring the variation, i.e., $C(p)-M(p)$, where $M \in \mathcal{R}(N, M_0)$ and $M_0$ is the initial marking of N.

With reference to FIG. 4A, $M_0(p_3)=C(p_3)=15$ KW. At marking $M_0$, it may not be determined that a fault occurs in the input lines of $p_3$. However, it may be determined that only $t_4$ is enabled since $C(p_3)-M_0(p_3) < W(t_3, p_3)$ When $t_4$ fires, thus:

$$M_1(p_3)=M_0(p_3)-p_3^O=12 \text{ KW},$$

where $M_1$ is a marking. Similarly, only $t_4$ is enabled at marking $M_1$ and $t_3$ is disabled since $C(p_3)-M_1(p_3) < W(t_3, p_3)$. When $t_4$ fires, $$M_2(p_3)=M_1(p_3)-p_3^O=9 \text{ KW},$$

where $M_2$ is a marking. At marking $M_2$, $t_3$ and $t_4$ are enabled since $C(p_3)-M_2(p_3)=6>W(t_3, p_3)=5$. If they fire, then $$M'_3(p_3)=M_2(p_3)+p_3^I-p_3^O=11 \text{ KW},$$

where $M'_3$ is a marking. At marking $M_2$, it is assumed that a fault occurs in the input lines of $p_3$ (this means that $t_3$ cannot fire to add tokens to $p_3$). Therefore, only $t_4$ can fire at marking $M_2$. When $t_4$ fires, $$M'_3(p_3)=M_2(p_3)-p_3^O=6 \text{ KW},$$

where $M'_3$ is a marking. It is observed that:

$$p_3^I > C(p_3) - M_1(p_3) = 3 \text{ KW} < p_3^I + p_3^O = 8 \text{ KW},$$

$$p_3^I < C(p_3) - M_2(p_3) = 6 \text{ KW} < p_3^I + p_3^O = 8 \text{ KW},$$

$$p_3^I < C(p_3) - M'_3(p_3) = 4 \text{ KW} < p_3^I + p_3^O = 8 \text{ KW, and}$$

$$p_3^I < C(p_3) - M_3(p_3) = 9 \text{ KW} > p_3^I + p_3^O = 8 \text{ KW}.$$

At markings $M_0$, $M_1$, $M_2$, and M', it is not sure whether $t_3$ has fired. At marking $M_3$, it is sure that $t_3$ does not fire. Therefore, the fault that occurs in the input lines of $p_3$ can be detected by monitoring the variation, i.e., $C(p_3) - M(p_3)$, where $M \in \mathcal{R}(N, M_0)$ As discussed earlier, to detect faults in an ES, electric current sensor may be used to detect the electric power variation of the ES. If a fault is detected, a message may be sent to an electric controller to restore the fault.

Definition 2: Let N be a C-TPTS with $N = (P_h \cup P_m \cup P_1, T, F, W, C)$ and $p_k \in (P_h \cup P_m \cup P_1)$ be an ES. The supervisor of $p_k$ is defined as a finite capacity Petri net $N_s^{pk} = (\{p_k^s, p_k^e\}, {}^\bullet p_k \cup p_k^\bullet \cup \{t_k^d\}, F_k, W_k, C_k)$, where 1) $p_k^s$ is an electric current sensor and $p_k^e$ is an electric controller.

2) $t_k^d$ is a fault detecting operation.

3) $F_k = F_k^i \cup F_k^j \cup \{(p_k^s, t_k^d), (t_k^d, p_k^s), (t_k^d, p_k^e)\}$ is the flow relation, where $$F_k^i = \cup_{t_i \in {}^\bullet p_k} \{(p_k^s, t_i)\} \text{ and } F_k^4 = \cup_{t_j \in p_k^\bullet} \{(t_j, p_k^s)\}.$$

4) $W_k: F_k \to \mathbb{N}$ is a mapping, where $$W_k(f) = \begin{cases} W((t_i, p_k)), & f = (p_k^s, t_i), \forall t_i \in {}^\bullet p_k, \\ W((p_k, t_j)), & f = (t_j, p_k^s), \forall t_j \in p_k^\bullet, \\ p_k^I + p_k^O, & f \in \{(p_k^s, t_k^d), (t_k^d, p_k^s)\}, \\ 1, & f = (t_k^d, p_k^e). \end{cases}$$

5) $C_k: \{p_k^s, p_k^e\} \to \mathbb{N}$ is a mapping, where $C_k(p_k^s) = C(p_k)$ and $C_k(p_k^e) = 2$.

Definition 3: Let N be a C-TPTS with $N = (P_h \cup P_m \cup P_1, T, F, W, C)$ and $N_s^{p1}, N_s^{p2}, \ldots$ and $N_s^{pn}$ be n supervisors with $N_s^{pk} = (\{p_k^s, p_k^e\}, {}^\bullet p_k \cup p_k^\bullet) \cup \{t_k^d\}, F_k, W_k, C_k)$, where $N_s^{pk}$ is the supervisor of $p_k$, $p_k \in (P_h \cup P_m \cup P_1)$, $n = |P_n \cup P_m \cup P_1|$, and $1 \leq k \leq n$. A supervised C-TPTS is defined as a finite capacity Petri net $N_{sc} = (P_{sc} \cup P_{scs} \cup P_{sce}, T_{sc}, F_{sc}, W_{sc}, C_{sc})$, where 1) $P_{sc} = (P_h \cup P_m \cup P_1)$,
2) $P_{scs} = \cup_{k=1}^{|P_h \cup P_m \cup P_1|} \{p_k^s\}$,
3) $P_{sce} = \cup_{k=1}^{|P_h \cup P_m \cup P_1|} \{p_k^e\}$,
4) $T_{sc} = T \cup (\cup_{k=1}^{|P_h \cup P_m \cup P_1|} \{t_k^d\})$, and
5) $\alpha_{sc} = \alpha \cup (\cup_{k=1}^{|P_h \cup P_m \cup P_1|} \alpha_k). \forall \alpha \in \{F, W, C\}$.

With reference to FIGS. 5A to 5C, an ES $p_k$, the supervisor $N_s^{pk}$ of $p_k$, and the combined system that is constructed by $p_k$ and $N_s^{pk}$, respectively. Referring to FIG. 5C, $M_0 = (n, 0, 0)^T$ is the initial marking. $p_k$ and $p_{k_c}^s$ may construct a P-invariant (the total number of tokens in $p_k$ and $p_k^s$ is an invariant). Then, $\forall M \in \mathcal{R}(N, M_0)$, and $$M(p_k) + M(p_k^s) = M_0(p_k) = C(p_k) \quad (6)$$

Thus, $M(p_k^s) = C(p_k) - M(p_k)$ is true. According to Property 1, a fault occurring in the input lines of $p_k$ can be detected at marking M if $$M(p_k^s) \geq p_k^I + p_k^O \quad (7)$$

Property 2: Let $N_{ac}$ be a supervised C-TPTS, $p_k \in P_{sc}$ be an ES that is controlled by its supervisor $N_s^{pk}$, and M be a marking of $N_{sc}$. $\exists M' \in \mathcal{R}(N_{sc}, M), M'(p_k^e) \geq 1$ if $$C(p_k) - M(p_k) \geq p_k^I + p_k^O.$$

Proof: At marking M, if $C(p_k) - M(p_k) \geq p_k^I + p_k^O$, $M(p_k^s) = C(p_k) - M(p_k) \geq p_k^I + p_k^O$ according to Eq. (6). Therefore, $t_k^d$ is enabled at M since $M(p_k^s) \geq W(p_k^s, t_k^d)$. Let σ be a transition sequence such that $\vec{\sigma}(t_k^d) = 1$. Then, $\exists M' \in \mathcal{R}(N_{sc}, M)$ such that $M [\sigma\rangle M'$ holds.

$$M'(p_k^e) = M(p_k^e) + \vec{\sigma}(t_k^d) \cdot W(t_k^d, p_k^e)$$
$$= M(p_k^e) + \vec{\sigma}(t_k^d)$$
$$= M(p_k^e) + 1 \geq 1$$

where $M(p_k^e) \geq 0$.

According to Property 2, a fault that occurs in the input lines of $p_k$ is detected by the supervisor of $p_k$ if $M(p_k^e) \geq 1$. With reference to FIG. 6A, there is provided an example embodiment of a combined system of an ES $p_3$ of FIG. 4A and its supervisor. Let $M_0 = (15, 0, 0)^T$ be the initial marking with $C(p_3) = M_0(p_3) = 15$. A fault occurs in the input lines of $p_3$ ($t_3$ cannot fire at all markings). After $t_4$ fires three times, a new marking $M_1 = (6, 9, 0)^T$ is reached by $M_0 [t_4 t_4 t_4\rangle M_1$. Then $$M_1(p_3^s) = C(p_3) - M_1(p_3) = 9 > p_3^I + p_3^O = 8.$$

Then, referring to FIG. 6B, the fault can be detected at marking $M_1$ (Eq. (7)). In its supervisor, $W(p_3^s, t_3^d) = p_3^I + p_3^O = 8$. Then, $t_3^d$ and $t_4$ are enabled at marking $M_1$. Therefore, a new marking $M_2 = (3, 12, 1)^T$ is obtained by $M_1 [\{t_4 t_3^d\}\rangle M_2$. Referring to FIG. 6C, at $M_2$, the fault is detected since $M_2(p_3^e) = 1$ (Property 2).

Preferably, faults detected by the detection module 110 may be restored by the restoration module 112. In order to avoid large area blackouts during fault detection and restoration, the capacities for ESs 102 and their battery energy storage systems is estimated.

Let $N_{sc}$ be a supervised C-TPTS. $\forall p_k \in P_{sc}$, there may exist an ES $p_1 \in P_{sc}$ such that $p_k \neq p_1$ and $p_k$ is preconnected with $p_1$ by emergency lines and an electric switch if $$p_l^I - p_l^O = p_l^A \geq p_k^O \quad (8)$$

where the electric switch that is opened at initial states is controlled by the electric controller $p_k^e$ n the supervisor of $p_k$. The preconnected ES $p_1$ is called the solution of $p_k$. ES $p_k$ may have several solutions. With reference to FIG. 7A, the preconnection between $p_k$ and $p_1$ is illustrated, where $t_k^e$ is an electric switch that is controlled by $p_k^e$. Therefore, $\forall M \in \mathcal{R}(N_{sc}, M_0)$ ($M_0$ is the initial marking of $N_{sc}$), $p_1$ can supply electric power to $p_k$ if $M(p_4^e) \geq 1$ (this represents that the corresponding electric switch between $p_l$ and $p_k$ is closed at marking M).

Definition 4: Let $N_{sc}$ be a supervised C-TPTS with $N_{sc} = (P_{sc} \cup P_{scs} \cup P_{sce}, T_{sc}, F_{sc}, W_{sc}, C_{sc})$. An intelligent C-TPTS is defined as a finite capacity Petri net $N_{ic} = (P_{ic} \cup P_{ics} \cup P_{ice}, T_{ic} \cup T_{ew}, F_{ic}, W_{ic}, C_{ic}, E_{ic})$, where 1) $P_{ic} = P_{sc}$, $P_{ics} = P_{scs}$, $P_{ice} = P_{sce}$, $T_{ic} = T_{sc}$, and $C_{ic} = C_{sc}$.

2) $T_{ew}$ is a set of electric switches.

3) $E_{ic} \subseteq (P_{ic} \times T_{ew} \times P_{ic})$ is the set of emergency supply relation, where $\forall (p_k, t_k^e, p_1) \in E_{ic}$, $p_l$ is the solution of $p_k$ ($p_k \in P_{ic}$, $t_k^e \in T_{ew}$, and $p_1 \in P_{ic}$).

4) $F_{ic} = F_{sc} \cup F_{ew}$, where
$F_{ew} = \cup_{\forall (p_k, t_k^e, p_l) \in E_{ic}} \{(p_k^s, t_k^e), (p_k^e, t_k^e), (t_k^e, p_k), (p_l, p_k^e)\}$, $p_l^s \in P_{scs}$, and $p_k^e \in P_{sce}$.

5) $W_{ic} = W_{sc} \cup W_{ew}$, where $\forall (p_k, t_k^e, p_1) \in E_{ic}$ such that $W_{ew}((p_k^s, t_k^e)) = W_{ew}((t_k^e, p_k)) = W_{ew}((p_l, p_k^e)) = p_k^O$ and $W_{ew}((p_k^e, t_k^e)) = 1$, where $p_k^s \in P_{scs}$ and $p_k^e \in P_{sce}$.

Figure 7B:
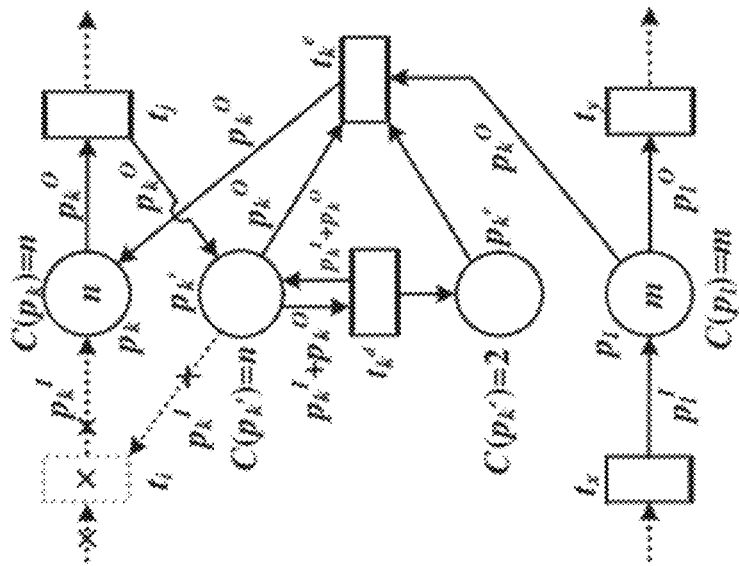
FIG. 7B is an illustration showing a petri net representation of the ESs of FIG. 7A with the combination structure of $p_k$, the supervisor $N_s^{pk}$ of $p_k$, and the solution $p_1$ of $p_k$.
Figure 7A:
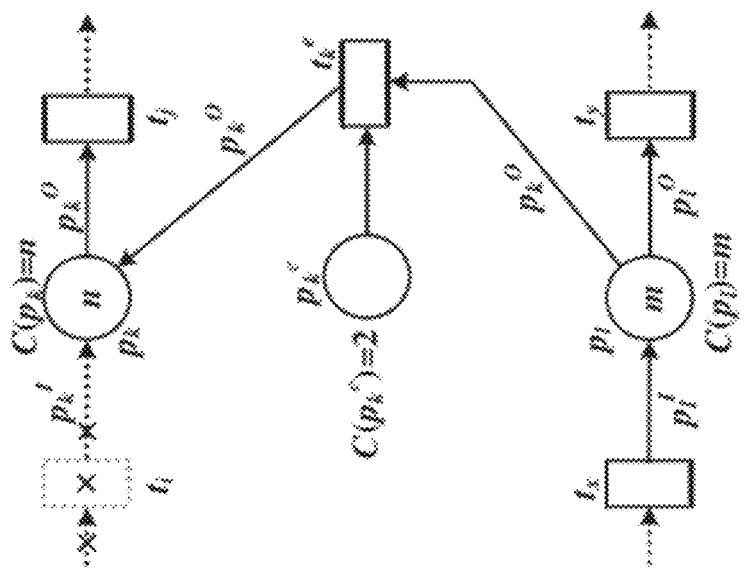
FIG. 7A is an illustration showing a petri net representation of a paired of preconnected ESs $p_k$ and $p_1$.

With reference to FIG. 7B, there is provided an example embodiment of a combinational structure of an ES $p_k$, a solution of $p_k$, and the supervisor of $p_k$ in an intelligent C-TPTS. $(p_k, t_k^e, p_1) \in E_{ic}$ is an emergency supply relation. The intelligent C-TPTS has the property of automatic fault detection and restoration. Then, solution $p_1$ can supply electric power to $p_k$ to restore a fault if the fault is detected by the supervisor of $p_k$.

In order to avoid a large area blackout in an intelligent C-TPTS, each battery energy storage system of an ES should have suitable capacity to store enough power to maintain the output of the ES during the fault detection and restoration.

Definition 5: Let $\mathbb{R}$ be the set of real numbers and $\mathbb{Z}$ be the set of integers. $\lceil x \rceil$: $\mathbb{R} \to \mathbb{Z}$ is a ceiling function such that $$\lceil x \rceil = \min\{n \in \mathbb{Z}, x \leq n\}, \text{ where } x \in \mathbb{R}.$$

For example, $\lceil 2.1 \rceil = 3$, $\lceil 2.9 \rceil = 3$, and $\lceil 2 \rceil = 2$.

Theorem 1: Let $N_{ic}$ be an intelligent C-TPTS, $p_k \in P_{ic}$ be an ES, $N_s^{pk}$ be the supervisor of $p_k$, $p_1$ be a solution of $p_k$, and $M_0$ be the initial marking of $N_{ic}$ such that $M_0(p_k) = C(p_k)$. The large area blackouts occurred in $p_k$ can be avoided if $$\begin{cases} m = \lceil (p_k^I + p_k^O)/p_k^O \rceil, m \in \mathbb{N} \\ C(p_k) \geq (m+2)p_k^O, \end{cases} \quad (9)$$

Proof: Let $\sigma_1$ be a transition sequence and $(t_i) = {}^\bullet p_k$. If a fault occurs in the input lines of $p_k$, then $\vec{\sigma}_1(t_i) = 0$. It is assumed that $\forall t_j \in p_k^\bullet$, $\vec{\sigma}_1(t_j) = m$, where $m = \lceil (p_k^I + p_k^O)/p_k^O \rceil$ and $m \in \mathbb{N}$.

According to Property 1, $\exists M_1 \in \mathcal{R}(N_{ic}, M_0)$ such that $C(p_k) - M_1(p_k) \geq p_k^O + p_k^O$ and $M_0[\sigma_1 \rangle M_1$. Then, the fault can be detected at marking $M_1$ by supervisor $N_s^{pk} = (\{p_k^s, p_k^e\}, {}^\bullet p_k \cup p_k^\bullet \cup \{t_k^d\}, F_k, W_k, C_k)$.

$$M_1(p_k) = M_0(p_k) + \vec{\sigma}_1(t_i) \cdot W(t_i, p_k) - \sum_{t_j \in p_k^\bullet} \vec{\sigma}_1(t_i) \cdot W(t_i, p)$$

$$= M_0(p_k) - \sum_{t_j \in p_k^\bullet} m \cdot W(p_k, t_j)$$

$$= M_0(p_k) - m \cdot p_k^O.$$

Let $\sigma_2$ be a transition sequence such that $\vec{\sigma}_1(t_i) = 0$, $\forall t_j \in p_k^\bullet$, $\vec{\sigma}_1(t_j) = 1$, and $\vec{\sigma}_1(t_k^d) = 1$. According to Property 2, $\exists M_2 \in \mathcal{R}(N_{ic}, M_1)$ such that $M_2(p_k^p) \geq 1$ and $M_1[\sigma_2 \rangle M_2$. Then, the fault is detected by the supervisor $N_s^{pk}$ at marking $M_2$.

$$M_2(p_k) = M_1(p_k) + \vec{\sigma}_1(t_i) \cdot W(t_i, p_k) - \sum_{t_j \in p_k^\bullet} \vec{\sigma}_1(t_i) \cdot W(p_k, t_j)$$

$$= M_1(p_k) - \sum_{t_j \in p_k^\bullet} m \cdot W(p_k, t_j)$$

$$= M_1(p_k) - p_k^O = M_0(p_k) - (m+1)p_k^O.$$

The ES $p_1$ is the solution of $p_k$ and the electric switch between $p_1$ and $p_k$ is controlled by $p_k^e$. Therefore, $p_1$ begins to supply electric power to $p_k$ since the electric switch is closed at marking $M_2$, i.e., $M_2(p_k^e) \geq 1$. In order to avoid large area blackouts in $p_k$, $\forall M \in \mathcal{R}(N_{ic}, M_0)$, $M(p_k) \geq p_k^O$. Therefore, $$M_2(p_k) = M_0(p_k) + (m+1)p_k^O \Rightarrow M_0(p_k) \geq (m+2)p_k^O.$$

Since $M_0(p_k) = C(p_k)$, □

$$\begin{cases} m = \lceil (p_k^I + p_k^O)/p_k^O \rceil, m \in \mathbb{N} \\ C(p_k) \geq (m+2)p_k^O, \end{cases}$$

According to Theorem 1, $\forall p_k \in P_{ic}$, if $p_k$ is supervised by a supervisor, the faults that occur in the input lines of $p_k$ can be detected. If $p_k$ has a solution, the fault that is detected by its supervisor can be restored. If the capacity of battery energy storage system in $p_k$ satisfies Eq. (9), large area blackouts that may be caused by the faults can be avoided during the fault detection and restoration.

In yet another example embodiment, with reference to FIG. 3B, it may be assumed that $p_3^I = 5$ KW (kilowatts), $p_3^O = 3$ KW, $p_4^I = 7$ KW, and $p_4^O 32\ 4$ KW. Then, $p_4^A = p_4^I - p_4^O = 3$ KW and $m = \lceil (p_3^I + p_3^O)/p_3^O \rceil = \lceil 8/31 \rceil = 3$. Thus, $$C(p_3) \geq (m+2)p_3^O = (3+2)3 \text{ KW} = 15 \text{ KW}.$$

Figure 8B:
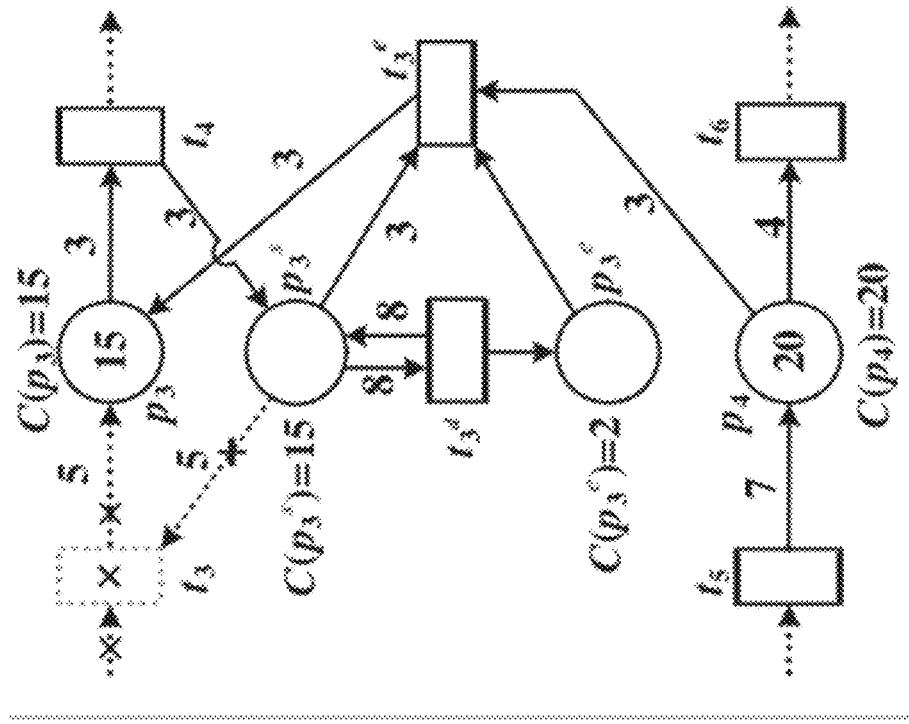
FIG. 8B is an illustration showing a petri net representation of the ESs $p_3$ and $p_4$ of FIG. 8A with the supervisor of $p_3$ in accordance with FIG. 7B.
Figure 8A:
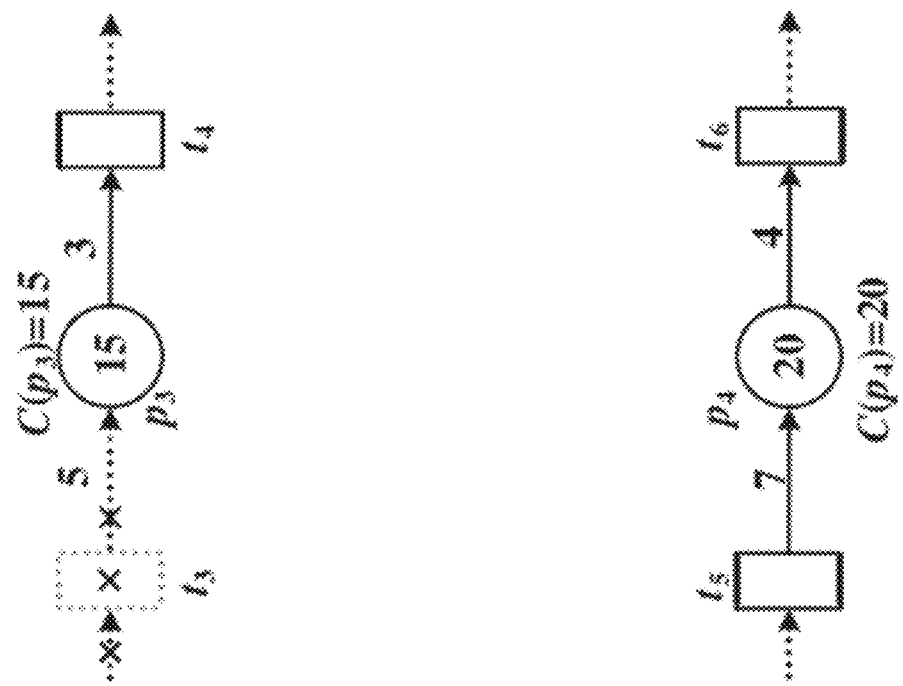
FIG. 8A is an illustration showing a petri net representation of the ES $p_3$ and its solution $p_4$ in accordance with FIG. 4A when a fault occurs.

Let $C(p_3) = 15$ KW. Similarly, $C(p_4) = 20$ KW and $p_4$ is a solution of $p_3$ by $p^1{}_4{}^A = p_3^O$, as illustrated in FIG. 8A. If a fault occurs in the input lines of $p_3$ (this means that $t_3$ cannot fire to add tokens to $p_3$), the fault should be detected by the supervisor of $p_3$ and be restored by its solution $p_4$. Referring to FIG. 8B, there is shown the combined system. The initial marking is $M_0 = (15, 20, 0, 0)^T$ and the input and output matrices are $$[N]^+ = \begin{pmatrix} 500003 \\ 007000 \\ 030080 \\ 0000100 \end{pmatrix} \text{ and } [N]^- = \begin{pmatrix} 030000 \\ 000403 \\ 500083 \\ 000001 \end{pmatrix}$$

Figure 8D:
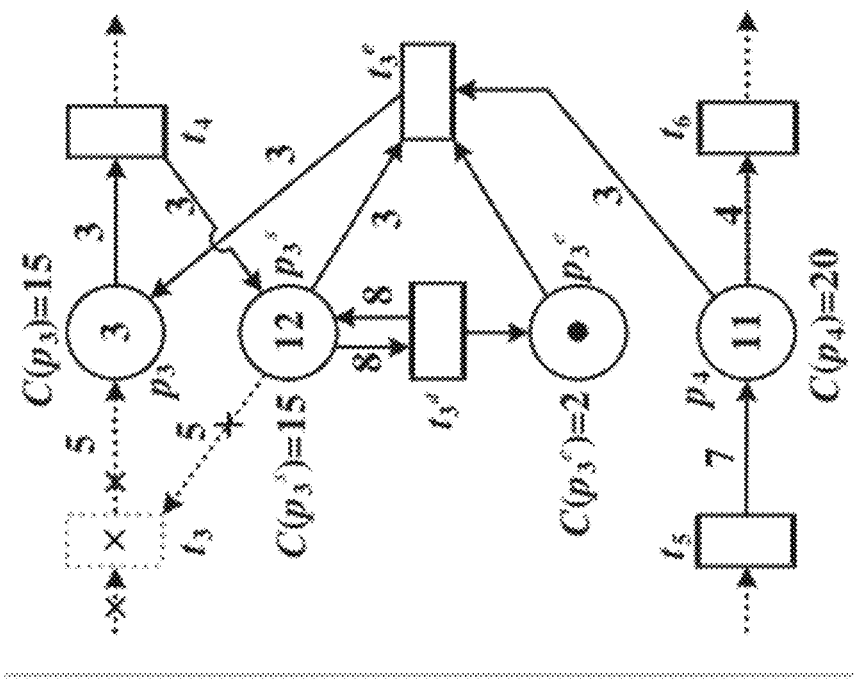
FIG. 8D is an illustration showing a petri net representation of the combined system of FIG. 8B when the fault is detected.
Figure 8C:
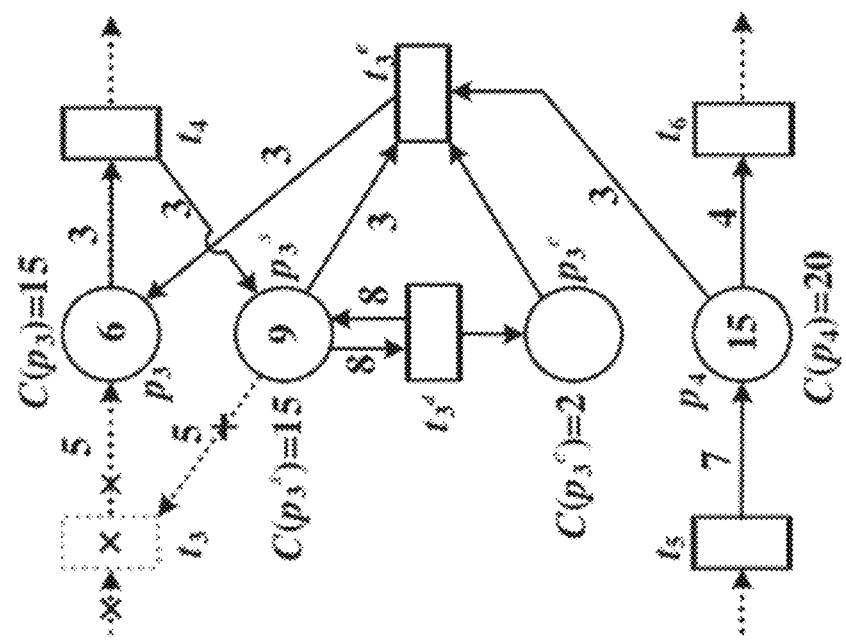
FIG. 8C is an illustration showing a petri net representation of the combined system of FIG. 8B when the fault may be detected.
Figure 8E:
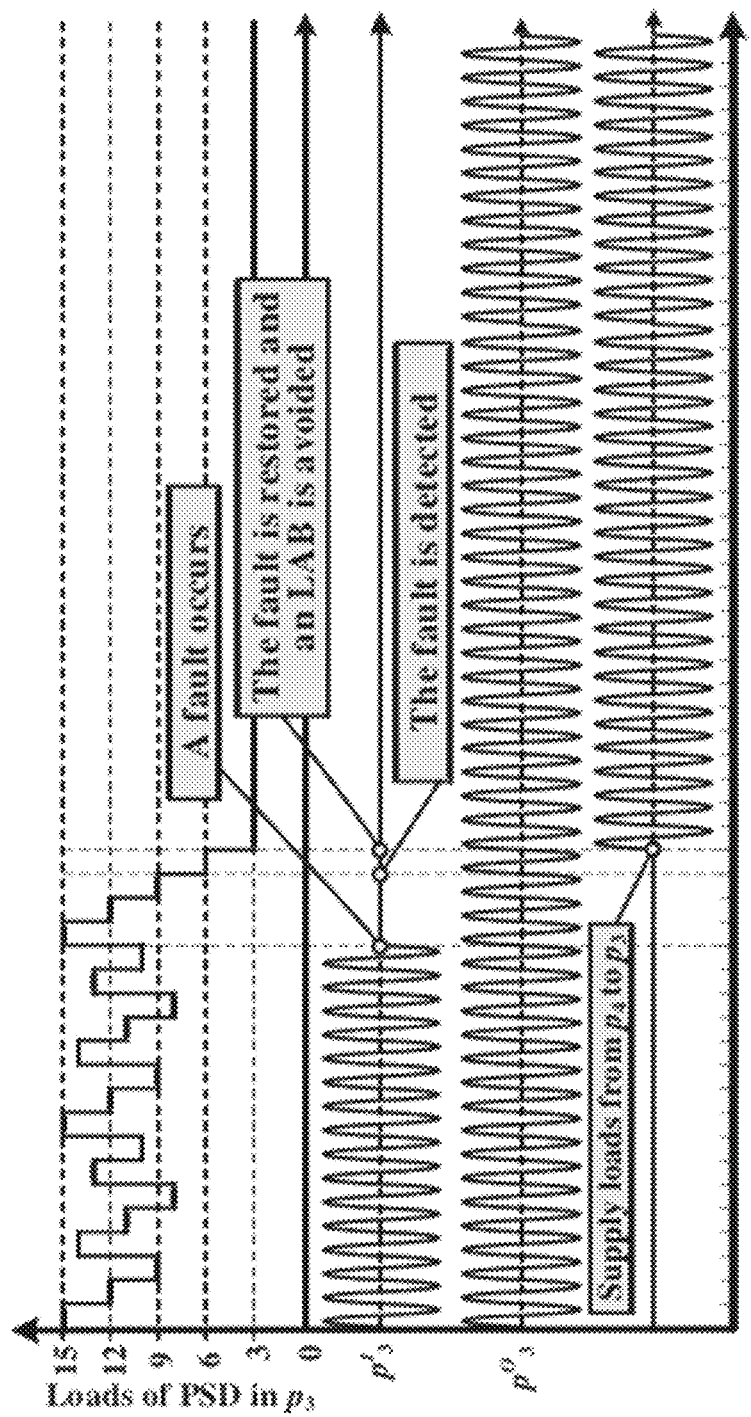
FIG. 8E is an illustration showing the evolution of whole processes in $p_3$ of FIG. 8B, including the fault detection and restoration processes.

At marking $M_0$, $t_4$ and $t_6$ are enabled and $t_5$ is disabled due to $C(p_4) - M_0(p_4) = 0 < W(t_5, p_4) = 7$. Let $\sigma_1 = (t_4\ t_6)$, $\vec{\sigma}_1 = (0, 1, 0, 1, 0, 0)^T$. When $t_4$ and $t_6$ fire, $$M_1 = M_0 + [N]^+ \cdot \vec{\sigma}_1 - [N]^- \cdot \vec{\sigma}_1 = (12,16,3,0)^T,$$

where $M_1$ is a new marking. At marking $M_1$, $t_4$ and $t_6$ are enabled and $t_5$ is disabled by $C(p_4) - M_1(p_4) = 4 < W(t_5, p_4) = 7$. Let $\sigma_2 = \{t_4\ t_6\}$. Then, $\vec{\sigma}_2 = (0, 1, 0, 1, 0, 0)^T$. When $t_4$ and $t_6$ fire, $$M_2 = M_1 + [N]^+ \cdot \vec{\sigma}_2 - [N]^- \cdot \vec{\sigma}_2 = (9,12,6,0)^T,$$

where $M_2$ is a new marking. At marking $M_2$, $t_4$, $t_5$, and $t_6$ are enabled by $C(p_4) - M_2(p_4) = 8 > W(t_5, p_4) = 7$. Let $\sigma_3 = \{t_4 t_5 t_6\}$. Then, $\vec{\sigma}_3 = (0, 1, 1, 1, 0, 0)^T$. When $t_4$, $t_5$, and $t_6$ fire, $$M_3 = M_2 + [N]^+ \cdot \vec{\sigma}_3 - [N]^- \cdot \vec{\sigma}_3 = (6,15,9,0)^T,$$

where $M_3$ is a new marking. The marking $M_3$ is illustrated in FIG. 8C. At marking $M_3$, $t_4$, $t_6$, and $t_3^d$ are enabled. Let $\sigma_4 = \{t_4 t_6 t_3^e\}$, $\vec{\sigma}_4 = (0, 1, 0, 1, 1, 0)^T$. When $t_4$, $t_6$, and $t_3^d$ (the fault is detected) fire, $$M_4 = M_3 + [N]^+ \cdot \vec{\sigma}_4 - [N]^- \cdot \vec{\sigma}_4 = (3,11,12,1)^T,$$

where $M_4$ is a new marking. The marking $M_4$ is illustrated in FIG. 8D. At marking $M_4$, $t_4$, $t_5$, $t_6$, $t_3^d$, and $t_3^e$ are enabled. Let $\sigma_5 = \{t_4 t_5 t_6\ t_3^e\}$, $\vec{\sigma}_5 = (0, 1, 1, 1, 1, 1)^T$. When $t_4$, $t_5$, $t_6$, $t_3^d$, and $t_3^e$ fire, $$M_5 = M_4 + [N]^+ \cdot \vec{\sigma}_5 - [N]^- \cdot \vec{\sigma}_5 = (3,11,12,1)^T = M_4,$$

where $M_5$ is a new marking. Then, $\forall M \in \mathcal{R}$ $(N_{ic}, M_4)$ $t_4$, $t_5$, $t_6$, and $t_3^e$ are enabled. When they fire, $$M = M_4 + [N]^+ \cdot \vec{\sigma} - [N]^- \cdot \vec{\sigma} = M_4,$$

where $\sigma$ is a transition sequence such that $\sigma = \sigma_5$ and $\vec{\sigma} = \vec{\sigma_5}$. The entire processes are illustrated in FIG. 8E. Therefore, the electric power of $p_3$ can be supplied from $p_4$. The fault is restored and a large area blackout is avoided.

These embodiments are advantageous in that the controller systems may prevent large area blackouts by automatically detect and restore a fault occurred in a power transmission network of a power transmission system. Each ES in a TPTS may be supervised by a corresponding supervisor. The electric power variations of the ES are monitored by the supervisor of the ES, and the supervisor may detect faults that occur in the input lines of the ES.

Advantageously, the ES may be preconnected with other ESs such that these preconnected ESs may supply electric power to the faulty ES to restore the faults. In addition, the ES may also contain a battery energy storage system to store electric power for the temporary output of the ES during its fault detection and restoration. Therefore, large area blackouts are avoided with the temporary supply of the battery energy storage system.

Moreover, the TPTS may be formally modelled and represented by Petri nets and the correctness of the fault detection and restoration is verified by the mathematical analysis methods of Petri nets. For example, the controller system may be simulated by IEC 61499 and may be implemented in PLCs (Programmable Logic Controllers) to construct a virtual smart grid. The correctness of the fault detection and restoration may then be verified by analyzing such a virtual smart grid.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A system for controlling a power transmission system comprising:
    a detection module arranged to detect an occurrence of a fault in at least one faulty electrical substation of a plurality of electrical substations of the power transmission system; and
    a restoration module arranged to at least temporally maintain an output power of the at least one faulty electrical substation;
and wherein at least one of the plurality of electrical substations is operable to facilitate maintaining the output of the at least one faulty electrical substation upon the detection of the occurrence of the fault, wherein the fault is a failure of receiving an input power from an original energy source in the at least one faulty electrical substation.

2. The system in accordance with claim 1, wherein the restoration module is further arranged to activate an auxiliary energy source arranged to at least temporally maintain the output power of the at least one faulty electrical substation.

3. The system in accordance with claim 2, wherein the auxiliary energy source includes at least one healthy electrical substations of the plurality of electrical substations, wherein the at least one healthy electrical substation is different from the at least one faulty electrical substation.

4. The system in accordance with claim 3, wherein at least two of the plurality of electrical substations are electrically interconnected.

5. The system in accordance with claim 4, when the at least two interconnected electrical substations include the at least one faulty electrical substation and the at least one healthy electrical substation, the at least one healthy electrical substation is configured to supply the input power to the at least one faulty electrical substation interconnected thereto so as to maintain the output of the at least one faulty electrical substation upon the occurrence of the fault.

6. The system in accordance with claim 4, wherein the at least two interconnected electrical substations belong to a same tier of a hierarchy of the power transmission system.

7. The system in accordance with claim 4, wherein the at least two interconnected electrical substations belong to a same stage of different branches of the power transmission system.

8. The system in accordance with claim 3, wherein the electrical connectivity between the interconnected electrical substations are controlled by the restoration module.

9. The system in accordance with claim 2, wherein the auxiliary energy source includes an energy storage system.

10. The system in accordance with claim 1, wherein the detection module is arranged to detect the occurrence of the fault by monitoring variations of the input power and the output power of the plurality of electrical substations.

11. The system in accordance with claim 10, wherein the detection module is further arranged to monitor transitions associated with the variations of the input power and the output power.

12. The system in accordance with claim 11, wherein the detection module is further arranged to compare a monitored parameter associated with the input power, the output power and the transitions monitored by the detection module with a predetermined threshold, such that the detection module is further arranged to determine the occurrence of the fault based on a comparison result associated with the compared monitored parameter and the predetermined threshold.

13. The system in accordance with claim 12, wherein the detection module is arranged to represent the plurality of electrical substations and the monitored transitions as one or more petri nets.

14. A power transmission system comprising:
    a plurality of electrical substations and a plurality of transmission lines arranged to connects the plurality of electrical substations to form a power transmission network; and
    a controller system arranged to control a power transmission within the power transmission network, wherein the controller system includes:
        a detection module arranged to detect an occurrence of a fault in at least one faulty electrical substation of the plurality of electrical substations; and
        a restoration module arranged to at least temporally maintain an output power of the at least one faulty electrical substation;
and wherein at least one of the plurality of electrical substations is operable to facilitate maintaining of the output of the at least one faulty electrical substation upon the detection of the occurrence of the fault, wherein the fault is a failure of receiving an input power from an original energy source in the at least one faulty electrical substation.

15. The power transmission system in accordance with claim 14, wherein at least two of the plurality of electrical substations are electrically interconnected, and when the at least two interconnected electrical substations include the at least one faulty electrical substation and at least one healthy electrical substation, the at least one healthy electrical substation is configured to supply the input power to the at least one faulty electrical substation interconnected thereto so as to maintain the output of the at least one faulty electrical substation upon the occurrence of the fault.

16. The power transmission system in accordance with claim 15, further comprising an electrical switch arranged to selectively connect the at least two interconnected electrical substations electrically, wherein the electrical switch is controlled by the restoration module.

17. The power transmission system in accordance with claim 14, wherein the restoration module further comprises an energy storage system arranged to temporally maintain the output power of the at least one faulty electrical substation.

18. The power transmission system in accordance with claim 14, wherein the detection module further comprises an electrical sensing module arranged to obtain electrical parameters associated with the input power and the output power so as to facilitate the detection of the occurrence of the fault in the plurality of the electrical substations based on the electrical parameters.

* * * * *